(12) United States Patent
Ballantyne et al.

(10) Patent No.: US 8,296,557 B1
(45) Date of Patent: Oct. 23, 2012

(54) PROVIDING MULTIPLE SELECTABLE CONFIGURATION SOURCES FOR PROGRAMMABLE INTEGRATED CIRCUITS WITH FAIL SAFE MECHANISM

(75) Inventors: Richard S. Ballantyne, Stittsville (CA); Mark Paluszkiewicz, Schaumburg, IL (US); Henry E. Styles, Menlo Park, CA (US); Ralph D. Wittig, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 393 days.

(21) Appl. No.: 12/609,174

(22) Filed: Oct. 30, 2009

(51) Int. Cl.
*G06F 1/24* (2006.01)
*G06F 9/00* (2006.01)

(52) U.S. Cl. ....................................... 713/100
(58) Field of Classification Search ................ 713/100
See application file for complete search history.

(56) References Cited

U.S. PATENT DOCUMENTS

| | | | | |
|---|---|---|---|---|
| 6,332,137 B1* | 12/2001 | Hori et al. | ........................ | 706/15 |
| 7,328,335 B1* | 2/2008 | Sundararajan et al. | ........... | 713/1 |
| 7,607,005 B1* | 10/2009 | Lewis | ........................... | 713/100 |
| 7,673,271 B1* | 3/2010 | Becker et al. | ................. | 716/101 |
| 7,971,051 B2* | 6/2011 | Paul et al. | ...................... | 713/100 |
| 8,145,894 B1* | 3/2012 | Casselman | .................... | 713/100 |
| 2002/0156998 A1* | 10/2002 | Casselman | .................... | 712/227 |
| 2005/0246520 A1* | 11/2005 | Vadi et al. | ...................... | 713/100 |
| 2009/0085603 A1* | 4/2009 | Paul et al. | ........................ | 326/8 |

* cited by examiner

*Primary Examiner* — Mohammed Rehman
(74) *Attorney, Agent, or Firm* — W. Eric Webostad; Kevin T. Cuenot; Thomas George (57) ABSTRACT

Within a system comprising a programmable integrated circuit (IC), a method can include storing a first configuration within the system in a read-only memory that is independent of the programmable IC. The programmable IC, being loaded with the first configuration, comprises a circuit that accesses a data source external to the system over a communication link. A second configuration can be downloaded by the programmable IC from the data source. The second configuration can be stored within a random access memory within the system that is independent of the programmable IC. Responsive to a reconfiguration event, the programmable IC can be loaded with the second configuration from the random access memory.

17 Claims, 5 Drawing Sheets

PROVIDING MULTIPLE SELECTABLE CONFIGURATION SOURCES FOR PROGRAMMABLE INTEGRATED CIRCUITS WITH FAIL SAFE MECHANISM

FIELD OF THE INVENTION

One or more embodiments disclosed within this specification relate to integrated circuit devices (ICs) and to providing multiple, selectable configuration sources to a programmable IC. One or more embodiments further relate to fail safe mechanisms that address various conditions relating to reconfiguration of the programmable IC.

BACKGROUND

Programmable integrated circuit (IC) devices are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable circuitry. The programmable interconnect typically includes a large number of interconnect lines of varying lengths interconnected by programmable interconnect points (PIPs). The programmable circuitry implements the logic of a user design using programmable elements that can include, for example, function generators, registers, arithmetic logic, and so forth.

The programmable interconnect and programmable circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

The functionality of a programmable IC typically is controlled by providing data bits to the device for that purpose. The data bits are stored in an external memory and, from that memory, are provided to the programmable IC. The data bits specify the particular circuit, and thus, functions, to be provided by the programmable IC. Typically, a programmable read-only memory (PROM) is used to store the data bits specifying a particular circuit.

In some applications, a programmable IC is configured, or reconfigured as the case may be, frequently over a given period of time. For example, some applications require that the programmable IC be reloaded with a different set of data bits hundreds or thousands of times per day. Each time a different set of data bits is loaded into the programmable IC, the PROM first must be loaded with the set of data bits. Thus, the PROM is written to and read from approximately the same number of times as the programmable IC is reconfigured. Due to the limited number of read and/or write cycles available in the lifecycle of a PROM, one can see that using a PROM within an application requiring a high rate of programmable IC reconfiguration can lead to failure of the PROM as well as the system within which the programmable IC is disposed.

SUMMARY

The embodiments disclosed within this specification relate to integrated circuit devices (ICs) and to providing multiple, selectable configuration sources for a programmable IC.

One embodiment of the present invention includes a method implemented within a system comprising a programmable IC. The method includes storing a first configuration within the system in a read-only memory (ROM) that is independent of the programmable IC. The programmable IC, being loaded with the first configuration, comprises a circuit configured to access a data source external to the system over a communication link. The method includes downloading a second configuration from the data source and storing the second configuration within a random access memory (RAM) disposed within the system that is independent of the programmable IC. Responsive to a reconfiguration event, the second configuration can be loaded from the RAM into the programmable IC.

Another embodiment of the present invention includes a system. The system includes a RAM, a ROM storing a first configuration, and a programmable IC, being loaded with the first configuration, comprising a circuit configured to download a second configuration from a data source external to the system over a communication link and store the second configuration within the RAM. The system also includes a controller coupled to the programmable IC, the ROM, and the RAM. The controller can be configured to selectively grant the programmable IC access to the RAM and selectively load the first configuration from the ROM into the programmable IC. Responsive to a reconfiguration event, the controller is configured to load the second configuration from the RAM into the programmable IC.

Another embodiment of the present invention includes a system comprising a RAM, a ROM storing a first configuration, and a primary programmable IC, being loaded with the first configuration, comprising a circuit configured to download a second configuration from a data source external to the system over a communication link and store the second configuration within the RAM. The system includes at least one secondary programmable IC that is configurable only through the primary programmable IC and a controller coupled to the primary programmable IC, the ROM, and the RAM. The controller is configured to selectively grant the primary programmable IC access to the RAM and to selectively load the first configuration from the ROM into at least the primary programmable IC. Responsive to a reconfiguration event, the primary programmable IC, being loaded with the first configuration and having access to the RAM provided by the controller, is configured to load the second configuration from the RAM into the at least one secondary programmable IC.

DETAILED DESCRIPTION

While the specification concludes with claims defining the features of the embodiments of the invention that are regarded as novel, it is believed that the embodiments of the invention will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

One or more embodiments disclosed within this specification relate to integrated circuit devices (ICs) and to providing multiple, selectable configuration sources for a programmable IC. One or more embodiments further relate to fail safe mechanisms that address various conditions that can occur when reconfiguring the programmable IC. In accordance with the inventive arrangements disclosed herein, a read-only memory (ROM) can be used in combination with a random access memory (RAM). The ROM can store a baseline configuration of the programmable IC. The baseline configuration can be used as a fail-safe configuration of the programmable IC that is known to function properly.

Once loaded with the baseline configuration, the programmable IC can be enabled to download further configurations from one or more other data sources external or remote to the system within which the programmable IC is disposed. Once downloaded, the configuration(s) can be stored within the RAM. Responsive to a reconfiguration event, a downloaded configuration can be loaded into the programmable IC. The process of reloading of the programmable IC with the downloaded configurations can be monitored to determine whether an error condition has occurred. Upon detecting an error condition, the programmable IC can be reloaded with the baseline configuration. Further security measures, to be described herein in greater detail, can be used to restrict the ability to reconfigure the programmable IC.

Figure 1:
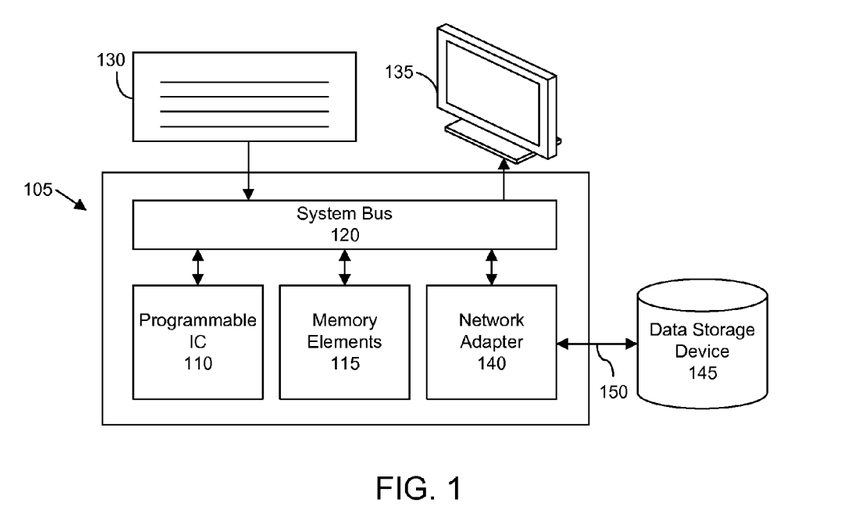
FIG. 1 is a first block diagram illustrating a system in accordance with one embodiment of the present invention.

FIG. 1 is a first block diagram illustrating a system 105 in accordance with one embodiment of the present invention. System 105 can include a programmable IC 110 coupled to memory elements 115 and a network adapter 140 through a system bus 120. In one embodiment, system 105 can be implemented as computer, such as a server. In this regard, system bus 120 can be implemented as any of a variety of different buses found within computer systems. For example, bus 120 can be implemented as a front side bus (FSB). It should be appreciated, however, that a computer is but one example of a system within which the embodiments disclosed herein can be implemented. As such, system 105 is not intended to be limited to a computer or a server, as the case may be.

Programmable IC 110 can be disposed within a processor socket of a card or other circuit board disposed within system 105. Programmable IC 110 can function as a processor in place of, or in addition to, a conventional processor that executes program code. Programmable IC 110 can be instantiated with one or more different hard circuits during operation of system 105, thereby accelerating operation of system 105. This circuit within programmable IC 110 can include a bus interface that couples programmable IC to system bus 120. Programmable IC 110, having been loaded with a particular configuration, can perform operations significantly faster than a conventional processor that performs the same operations, but which does so though the execution of program code.

As used within this specification, a "configuration," in reference to a programmable IC, refers to a set of configuration data that, when loaded into a programmable IC, implements a circuit, or portion of a circuit, that is dedicated to performing a particular task or tasks. In this regard, a configuration specifies a particular circuit that is implemented within the programmable IC. A configuration can be a complete configuration that specifies a complete circuit design or a partial configuration that specifies a part of a circuit design. A complete configuration can overwrite the configuration previously loaded into the programmable IC. A partial configuration leaves at least a portion of the previously loaded configuration, and thus circuit instantiated by the previously loaded configuration, intact. Accordingly, within this specification, when a programmable IC is loaded with a configuration, configured, or reconfigured, the programmable IC can be loaded with either a complete configuration or a partial configuration unless otherwise specified.

Memory elements 115 can include one or more physical memory devices such as, for example, local memory, one or more bulk storage devices, and ROM. Local memory can comprise random access memory (RAM) or other non-persistent memory device(s). Local memory can include RAM that is available to system 105 and/or RAM that is exclusively available to programmable IC 110 for storing one or more configurations downloaded from data sources external to system 105, e.g., data storage device 145. Bulk storage device(s) can comprise a hard drive or other persistent data storage device. ROM can be used to store a baseline configuration of programmable IC 110 that can be selectively and automatically reloaded into programmable IC 110 responsive to particular conditions or events.

Input/output (I/O) devices such as a keyboard 130, a display 135, and a pointing device (not shown) optionally can be coupled to system 105. The I/O devices can be coupled to system 105 either directly or through intervening I/O controllers (not shown). Network adapter 140 allows system 105 to become coupled to other systems, computer systems, remote printers, and/or remote data sources, such as data storage device 145, through a communication link 150. Data storage device 145 can be implemented as a network storage device, a computer system, or any other type of memory device that is external to system 105 and that can be accessed via a communication link.

Communication link 150 can represent one or more private or public networks, and/or comprise an Ethernet connection, an Internet Protocol (IP) connection, an HTTP connection, a Universal Serial Bus connection, or the like. Modems, cable modems, Ethernet cards, and bus adapters are example implementations of network adapter 140 that can be used with system 105.

In accordance with the embodiments disclosed herein, programmable IC 110 can be initially loaded with a baseline configuration. Though programmable IC 110 can be initially loaded with the baseline configuration when placed into system 105, the baseline configuration also can be stored within memory elements 115 and, more particularly, within a ROM of memory elements 115. The baseline configuration, when loaded into programmable IC 110, instantiates a baseline circuit within programmable IC 110.

Once loaded with the baseline configuration, programmable IC 110 is operable to perform particular functions needed within system 105. When system 105 is a computer, for example, programmable IC 110, when loaded with the baseline configuration, can boot system 105. Programmable IC 110 also can access data storage device 145 and download one or more additional configurations through network adapter 140 and communication link 150. The additional configuration(s) can be stored by the programmable IC 110 within a RAM of memory elements 115.

Programmable IC 110 can be dynamically loaded with the downloaded configurations during operation of system 105. Each different configuration can be a custom, user-specified configuration that instantiates a particular circuit that performs a specific task or tasks. The downloaded configuration(s) can be full configurations that completely reprogram programmable IC 110 or partial configurations that specify a portion of a circuit design and leave at least a portion of the baseline circuit design intact, e.g., unchanged, within programmable IC 110. By reconfiguring programmable IC 110 continually, as needed, the speed at which system 105 operates can be increased beyond that of a conventional server utilizing a conventional processor executing program code. Programmable IC 110 can download further configurations as needed, which then can be loaded into programmable IC 110 to implement any of a variety of custom processor circuits.

Figure 2:
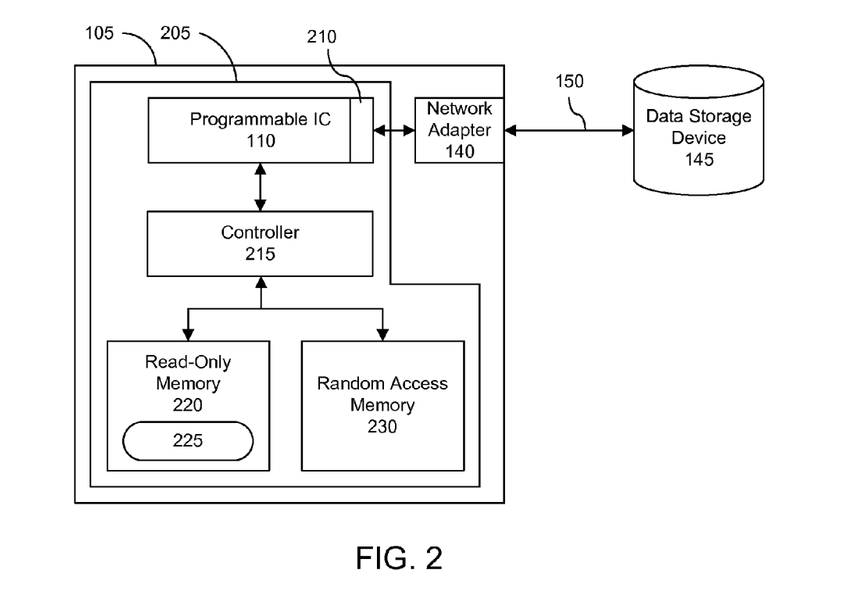
FIG. 2 is a second block diagram illustrating the system of FIG. 1 in accordance with another embodiment of the present invention.

FIG. 2 is a second block diagram illustrating system 105 of FIG. 1 in accordance with another embodiment of the present invention. In the example pictured in FIG. 2, particular elements of system 105, e.g., the system bus, have been excluded for purposes of illustration. As shown, system 105 includes network adapter 140, which communicates over communication link 150 with data storage device 145 as described.

As pictured in FIG. 2, system 105 includes a module 205 upon which programmable IC 110, a controller 215, a ROM 220, and a RAM 230 are disposed. Controller 215 is coupled to programmable IC 110, ROM 220, and RAM 230. As such, controller 215 controls whether programmable IC 110 is granted access to ROM 220 and/or RAM 230. ROM 220 can be a programmable ROM and can be preloaded, e.g., loaded with baseline configuration 225 when manufactured or upon being placed within module 205, with a baseline configuration 225 of programmable IC 110 as described with reference to FIG. 1.

Programmable IC 110 can be preloaded with baseline configuration 225 so that system 105 can immediately start operation when power is applied. In another embodiment, immediately upon startup of system 105, controller 215 can load baseline configuration 225 from ROM 220 into programmable IC 110. In any case, once loaded within programmable IC 110, baseline configuration 225 instantiates a baseline circuit within programmable IC 110 that provides functions needed for basic operation of system 105. For example, system 105 can be powered on and boot into a stable operating state using programmable IC 110 configured from baseline configuration 225.

Baseline configuration 225, once loaded, can create an IC interface 210 within programmable IC 110 as part of the instantiated circuit. In one embodiment, IC interface 210 can be a bus interface that facilitates communication between programmable IC 110 and one or more other elements of system 105 including network adapter 140. For example, when system 105 includes a FSB, IC interface 210 can couple programmable IC 110 to the FSB.

Baseline configuration 225 can configure programmable IC 110 to access one or more different data sources that are external to system 105. The data sources can store one or more additional configurations that can be downloaded by programmable IC 110 and stored within RAM 230 until needed. In one embodiment, programmable IC 110, having been loaded with baseline configuration 225, can be configured to query one or more different network locations and determine the addresses or locations of one or more data storage devices where additional configurations are stored. In another embodiment, programmable IC 110 can be configured, through baseline configuration 225, to access one or more predetermined addresses or locations for data storage devices that include configurations available for download.

Accordingly, programmable IC 110, utilizing IC interface 210, can access data storage device 145 through network adapter 140. One or more configurations can be downloaded from data storage device 145 over communication link 150. Controller 215, which regulates access of programmable IC 110 to RAM 230, can grant programmable IC 110 access to RAM 230. Programmable IC 110 can download the configuration(s) from data storage device 145 and store the downloaded configuration(s) within RAM 230.

At some point, a reconfiguration event can be detected. Responsive to detecting the reconfiguration event, controller 215 can access RAM 230 and the downloaded configuration stored therein. Controller 215 can load programmable IC 110 with the downloaded configuration to instantiate a new circuit, specified by the downloaded configuration, within programmable IC 110. As noted, the downloaded configuration can be a partial configuration that leaves at least a portion of circuit specified by baseline configuration 225 intact within programmable IC 110. For example, interface 210 can be left intact so that the downloaded configuration utilizes that portion of the circuit already in existence within programmable IC, though this need not be the case. In another embodiment, downloading of a configuration from data storage device 145 by programmable IC 110 can be performed responsive to detecting the reconfiguration event. Still, once downloaded, controller 215 can load the downloaded configuration into programmable IC 110.

Error checking, to be described herein in greater detail, can be implemented that, responsive to detecting an error condition, reloads baseline configuration 225 from ROM 220 into programmable IC 110. Reloading baseline configuration 225, which is known to function properly without error, ensures that system 105 continues operation and is not stopped due to a downloaded configuration that includes an error or an error that occurs during the loading of the downloaded configuration into programmable IC 110.

In one embodiment, ROM 220 and RAM 230 can be dedicated memory devices available only to programmable IC 110 and controller 215 as described. Controller 215, for example, can be implemented as a complex programmable logic device (CPLD) and can be used to couple programmable IC 110 to ROM 220 and/or RAM 230. In another embodiment, ROM 220 and/or RAM 230 can be part of the system 105 memory elements. In that case, ROM 220 and/or RAM 230 may or may not be shared with one or more other elements within system 105 and not be solely available to programmable IC 110 and/or controller 215 as described.

Figure 3:
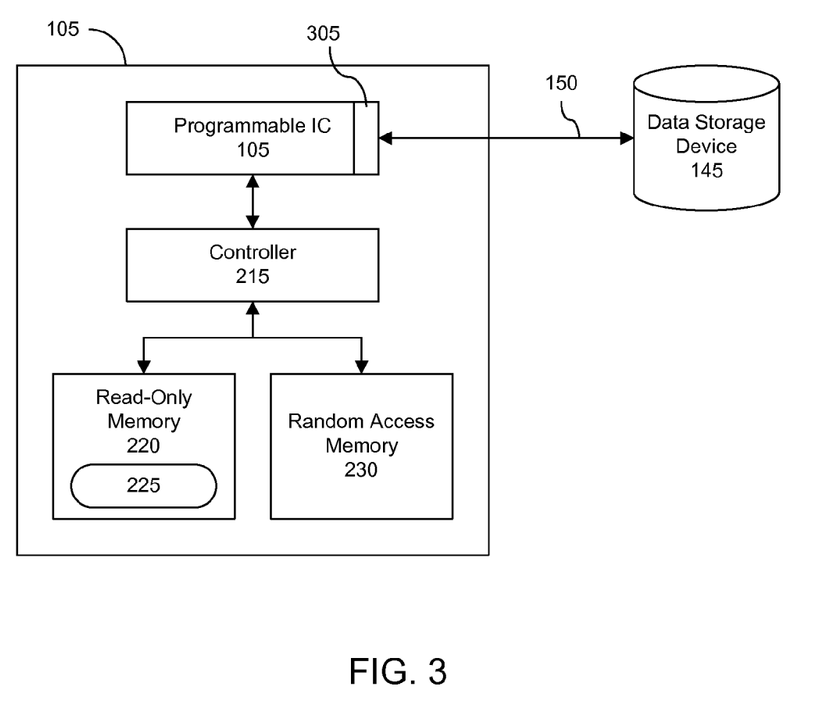
FIG. 3 is a third block diagram illustrating the system of FIG. 1 in accordance with another embodiment of the present invention.

FIG. 3 is a third block diagram illustrating system 105 of FIG. 1 in accordance with another embodiment of the present invention. In the example pictured in FIG. 3, particular elements of system 105 such as the system bus have been excluded for purposes of illustration. In this example, the network adapter also has been excluded, though system 105 still can include such a component. In the embodiment illustrated in FIG. 3, rather than utilizing the network adapter belonging to system 105 to access data storage device 145 over communication link 150, baseline configuration 225, once loaded into programmable IC 110, can instantiate IC interface 305.

IC interface 305 can be an "on-chip" interface that can communicate over communication link 150 with data storage device 145 or one or more other network locations as described with reference to FIG. 2 depending upon the particular type of communication link 150 that is used. In the embodiment illustrated in FIG. 3, programmable IC 110 still can include an interface, if required, for communicating with elements of system 105 to ensure proper operation of system 105. For example, programmable IC 110 can include a bus interface in addition to IC interface 305. The inclusion of IC interface 305 allows programmable IC 110 to communicate directly with external data storage devices for downloading configurations without having to utilize the network adapter belonging to system 105. Any network adapter of system 105 can be bypassed by IC interface 305 directly coupling to data storage device 145 via communication link 150.

Figure 4:
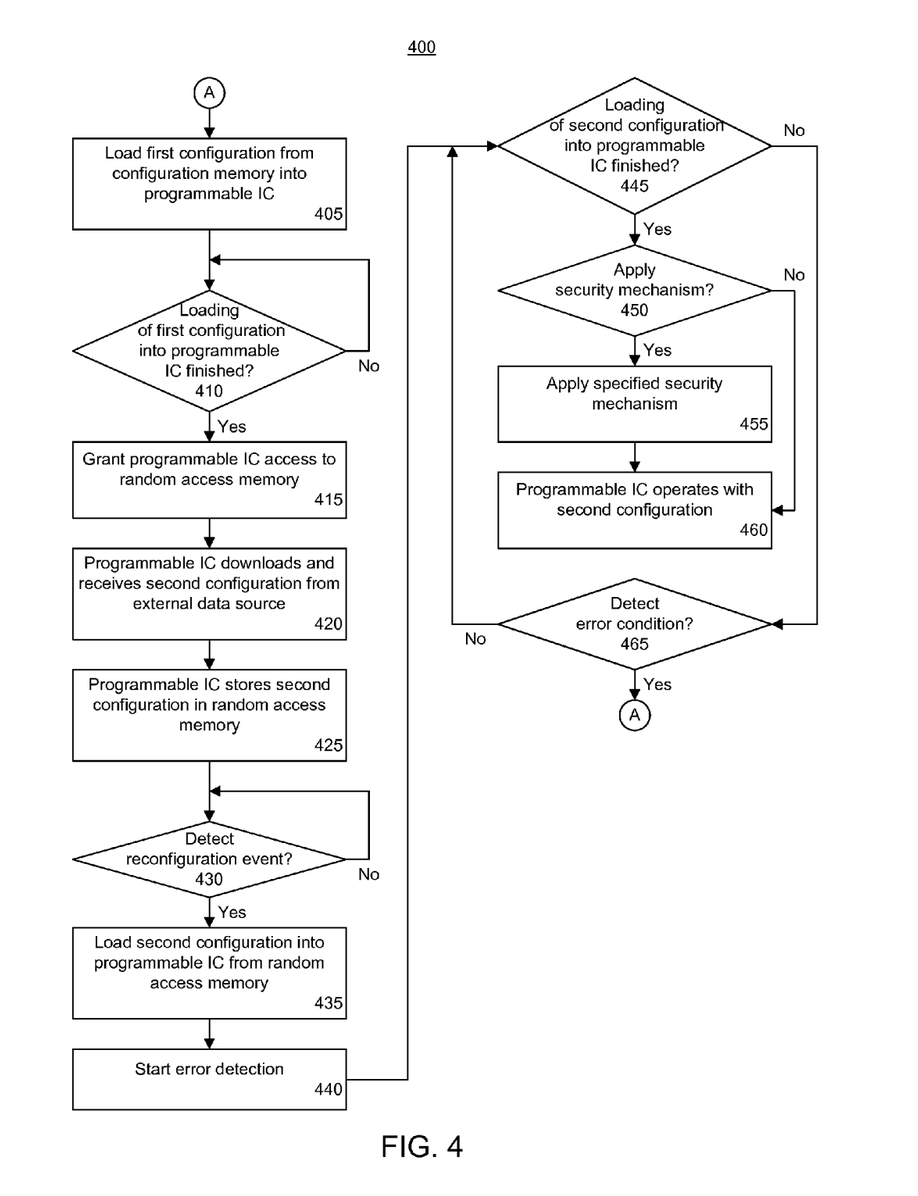
FIG. 4 is a first flow chart illustrating a method of accessing multiple, configuration sources for a programmable integrated circuit (IC) in accordance with another embodiment of the present invention.

FIG. 4 is a first flow chart illustrating a method 400 of accessing multiple, configuration sources for a programmable IC in accordance with another embodiment of the present invention. Method 400 can be performed by a system as described with reference to FIGS. 1, 2, and/or 3 within this specification. Method 400 can begin in step 405, where the baseline configuration, referred to as the first configuration, can be loaded into the programmable IC. As noted, the first configuration can be preloaded into the programmable IC prior to operation of the system within which the programmable IC is disposed. Alternatively, immediately upon startup of the system, the controller can load the first configuration from ROM into the programmable IC. The first configuration can be preloaded or pre-stored within the ROM.

In step 410, the controller can determine whether the loading of the first configuration into the programmable IC has finished. Typically, e.g., a signal is provided from the programmable IC to indicate a successful completion of the loading process. When the loading process is not finished, method 400 can iterate through step 410. When the loading process is finished, method 400 can proceed to step 415.

Within this specification, the term "signal" can refer to the conveyance of a single bit through a single wire, the conveyance of multiple parallel bits through multiple parallel wires, or the conveyance of one or more analog signals. Further, each signal may represent bi-directional communication between two, or more, components connected by the signal.

Once loaded with the first configuration, the controller can grant the programmable IC access to the RAM in step 415. The controller can grant access to the RAM responsive to any number of conditions including, but not limited to, completion of the loading of the first configuration into the programmable IC, the programmable IC, having been configured with the first configuration, querying one or more network locations and determining that a configuration is available for download, the programmable IC receiving a signal indicating availability of a configuration for download, or the like. Without access granted by the controller, the programmable IC cannot store configurations within, or read from, the RAM.

In step 420, the programmable IC can download and receive at least a second configuration from an external data source. In step 425, the programmable IC, with access granted by the controller, can store the downloaded second configuration within the RAM.

In step 430, a determination can be made as to whether a reconfiguration event has been detected. In one embodiment, the programmable IC can be configured to detect a reconfiguration event from within the system within which the programmable IC is disposed or from a source external to the system. In that case, any configuration with which the programmable IC is loaded can include circuitry for detecting a reconfiguration event such as receiving a reconfiguration signal. Having detected the reconfiguration event, the programmable IC can communicate with the controller and initiate a reconfiguration process performed by the controller.

Alternatively, the controller can be configured to detect a reconfiguration event such as receiving a reconfiguration signal. In that case, the controller can initiate reconfiguration of the programmable IC. Thus, when no reconfiguration event is detected, method 400 can continue to loop through step 430. When a reconfiguration event is detected, whether by the programmable IC or the controller, method 400 can continue to step 435.

In step 435, the controller can load the second configuration from RAM into the programmable IC. More particularly, the controller can begin the process of loading the second configuration into the programmable IC. In step 440, the controller can initiate an error detection process. In one embodiment, the controller can include a timer that can be set responsive to the loading of the second configuration from RAM, or any configuration from RAM for that matter, into the programmable IC. The timer can be loaded with a value, e.g., an amount of time, during which the programmable IC is expected to be successfully loaded with the second configuration. When the timer expires prior to completion of the successful configuration of the programmable IC, the controller determines that an error condition has occurred since the amount of time to which the timer is initialized is sufficient time for the second configuration to be loaded. In another aspect, the timer can be external to the controller and provide a signal to the controller upon expiration.

In another embodiment, the controller can count the amount of data that is loaded into the programmable IC. More particularly, the controller can count the amount of data, including the second configuration, that is provided to the programmable IC during the reconfiguration process. If the amount of data exceeds a predetermined amount of data, e.g., a threshold, that is equal to, or approximately equal to, an amount of data necessary to configure the programmable IC, the controller can determine that an error condition has occurred. It should be appreciated that, if so desired, both a timer and a data counting mechanism can be used in combination.

Proceeding to step 445, the controller can determine whether the process of loading the second configuration into the programmable IC has finished. When the process has not yet finished, method 400 can proceed to step 465. When the process has finished, method 400 can proceed to step 450.

Continuing with step 465, when the process of loading the second configuration into the programmable IC has not yet finished, the controller can determine whether an error condition has been detected. For example, when the controller utilizes a timer mechanism, the controller can determine whether the timer has expired. When the controller utilizes a data counting mechanism, the controller can determine whether the amount of data loaded into the programmable IC has exceeded the threshold.

When no error condition is detected, method 400 loops back to step 445 to continue the process of loading the second configuration into the programmable IC. When the controller does detect an error condition, method 400 can continue to step 405, where the first configuration stored in the ROM is loaded into the programmable IC. Detection of the error condition can indicate any of a variety of different security failings or concerns, whether attempted tampering with the loading process, a second configuration that comprises an error, etc. In such cases, the first configuration, which is known to be error free, and thus, a safe baseline configuration for the programmable IC, can be loaded into the programmable IC. This ensures that the system within which the programmable IC is disposed continues operation, at least at a baseline or basic level. If so desired, the process of downloading another configuration and loading that configuration into the programmable IC can be performed.

Referring to step 450, in the case where the process of loading the programmable IC with the second configuration has finished, the controller can determine whether or not a security mechanism is to be applied. One or more security mechanisms optionally can be used. When used, for example, based upon a user preference, the security mechanisms can be selectively engaged according to whether one or more security conditions are detected. In one embodiment, the security preferences specify the type of events, in terms of loading of the programmable IC with a configuration, that are to be counted by the controller. The count of events can be compared with a threshold "N," where N can be set to an integer that is greater than or equal to zero. When the count exceeds the value of N, the controller can prevent the programmable IC from being loaded with any configuration stored within the RAM. Further, the controller can deny the programmable IC access to the RAM to store any further downloaded configurations, thereby preventing further reconfiguration of the programmable IC with any configuration other than the first configuration stored within the ROM.

In one aspect, the controller can count the number of times that the programmable IC is successfully loaded with a configuration, or any configuration, from the RAM. In another aspect, the controller can count the number of times that an attempted load of the programmable IC with a configuration, or any configuration, from the RAM has been attempted, whether successful or not. In still another aspect, the controller can count the number of times that the programmable IC has been unsuccessfully loaded with a configuration, or any configuration, from the RAM. It should be appreciated that the controller can be configured to count any of the quantities described, or any combination of the quantities described, and that the resulting count can be compared with the value specified for "N."

When a security mechanism is to be applied as determined in step 450, method 400 can continue to step 455. If not, method 400 can proceed to step 460. In step 455, one or more security mechanisms can be applied as specified in the user-specified security preferences. As noted, the controller can prevent any further loading of a configuration into the programmable IC from the RAM and/or any further storing of a configuration into the RAM. In step 460, the system can enter a state in which the programmable IC, being loaded with the second configuration, can operate.

Method 400 describes various features relating to security and the detection of error conditions. The various steps described are intended to illustrate aspects of the embodiments of the invention in a non-limiting manner. For instance, though not illustrated, the controller or the programmable IC can continually monitor for a reconfiguration event after the loading of the second configuration, e.g., after entering step 460. Detection of a subsequent reconfiguration event, presuming that a security mechanism such as preventing the programmable IC from accessing the RAM has not been implemented, can cause method 400 to loop back to step 405. Looping back to step 405 can load the first configuration from ROM into the programmable IC so that further configurations can be downloaded.

It also should be appreciated that more than one configuration can be downloaded and stored in RAM concurrently if so desired. In that case, the RAM can include multiple configurations that the controller can select and load into the programmable IC as needed. In such an embodiment, the first configuration would not need to be loaded into the programmable IC before loading a third configuration. In one aspect, the particular configuration to be loaded from RAM into the programmable IC can be specified as part of the reconfiguration event that is detected, e.g., specified by a reconfiguration signal.

In another embodiment, a security override mechanism can be included that allows the number "N" to be overridden in particular circumstances. For example, a secure key, if provided to the controller, can be used to override or increase "N" to change or modify the conditions for restricting access to the RAM. Responsive to receiving such a key, for example, the controller can permit one or more additional loadings of the programmable IC with a configuration from the RAM. The number of additional configurations allowed can be specified or indicated by the key. The key can be provided, for example, as part of a reconfiguration signal.

Figure 5:
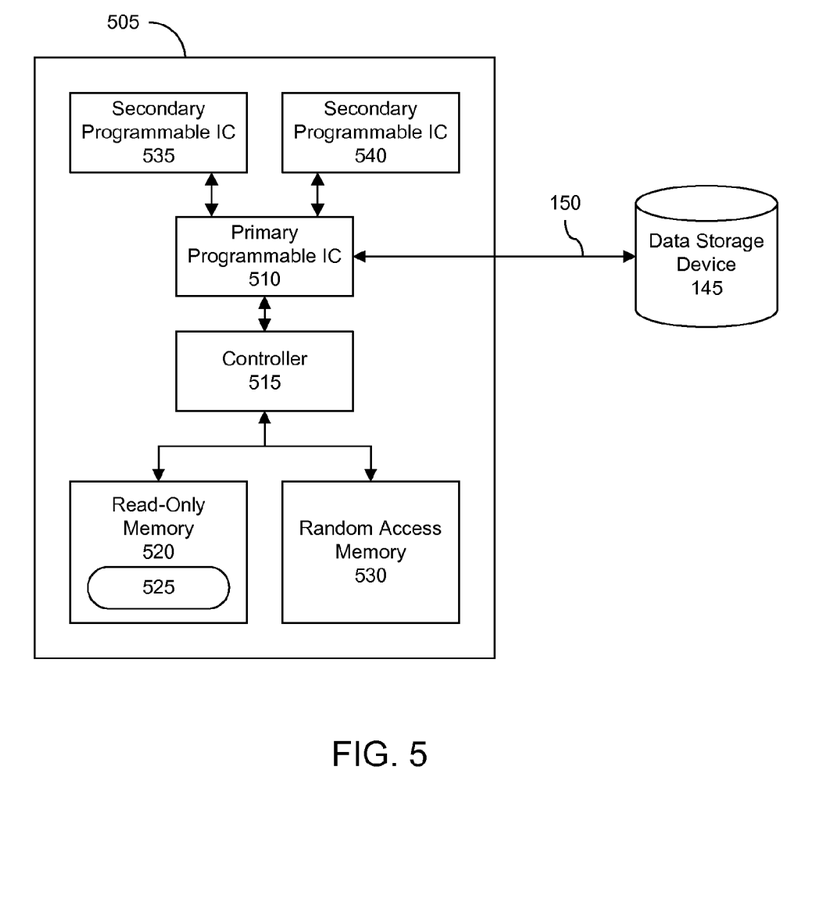
FIG. 5 is a fourth block diagram illustrating a system in accordance with another embodiment of the present invention.

FIG. 5 is a fourth block diagram illustrating a system 505 in accordance with another embodiment of the present invention. System 505 can include a primary programmable IC 510, a controller 515, a ROM 520 comprising a baseline configuration 525, and a RAM 530. System 505 can function like the system described with reference to FIGS. 1-4 in many respects. Rather than including a single programmable IC, system 505 can include primary programmable IC 510 and one or more secondary programmable ICs 535 and 540.

Primary programmable IC 510, being loaded with baseline configuration 525, can include a circuit that downloads one or more additional configurations from external, or remote, data storage device 145 via communication link 150. For purposes of illustration, the network adapter and the IC interface of programmable IC 510 are not illustrated. It should be appreciated that system 505 can function as described with reference to FIG. 2 or FIG. 3 in terms of the particular network interfaces and IC interface(s) that are included.

The security and error detection mechanisms described within this specification also can be incorporated into system 505. For example, primary programmable IC 510 can be selectively given access to RAM 530 by controller 515 to download additional configurations and store those configurations within RAM 530. Responsive to a reconfiguration event, whether detected by primary programmable IC 510 or controller 515, controller 515 can access a downloaded configuration from RAM 530 and load the downloaded configuration into primary programmable IC 510.

In one embodiment, the downloaded configuration, e.g., the second configuration, can be broadcast from primary programmable IC 510 to each of the secondary programmable ICs 535 and 540. Thus, responsive to the reconfiguration event, each of primary programmable IC 510 and secondary programmable ICs 535 and 540 can be loaded with the second configuration. In another embodiment, primary programmable IC 510 can remain configured with baseline configuration 525 and load secondary programmable ICs 535 and/or 540 with the downloaded configuration.

Error checking can be applied to the programmable ICs as a group or individually. For example, in the event of a detected error condition with respect to one of secondary programmable ICs 535 or 540, primary programmable IC 510 can re-broadcast the second configuration. Controller 515 can perform error checking regarding primary programmable IC 510. Primary programmable IC 510 alone, or in combination with controller 515, can perform error checking when loading secondary programmable ICs 535 and 540 with downloaded configurations.

In another embodiment, one or more different configurations can be loaded into the programmable ICs. For example, consider the case where primary programmable IC 510 downloads a second configuration and a third configuration. In that case, the controller can load the second configuration into the primary programmable IC 510. The controller 515 can send the third configuration, via primary programmable IC 510, to secondary programmable ICs 535 and 540 thereby causing the third configuration to be loaded into each of secondary programmable ICs 535 and 540. In another example, primary programmable IC 510 can remain configured with baseline configuration 525 and load the second configuration into secondary programmable IC 535 and the third configuration into secondary programmable IC 540.

Figure 6:
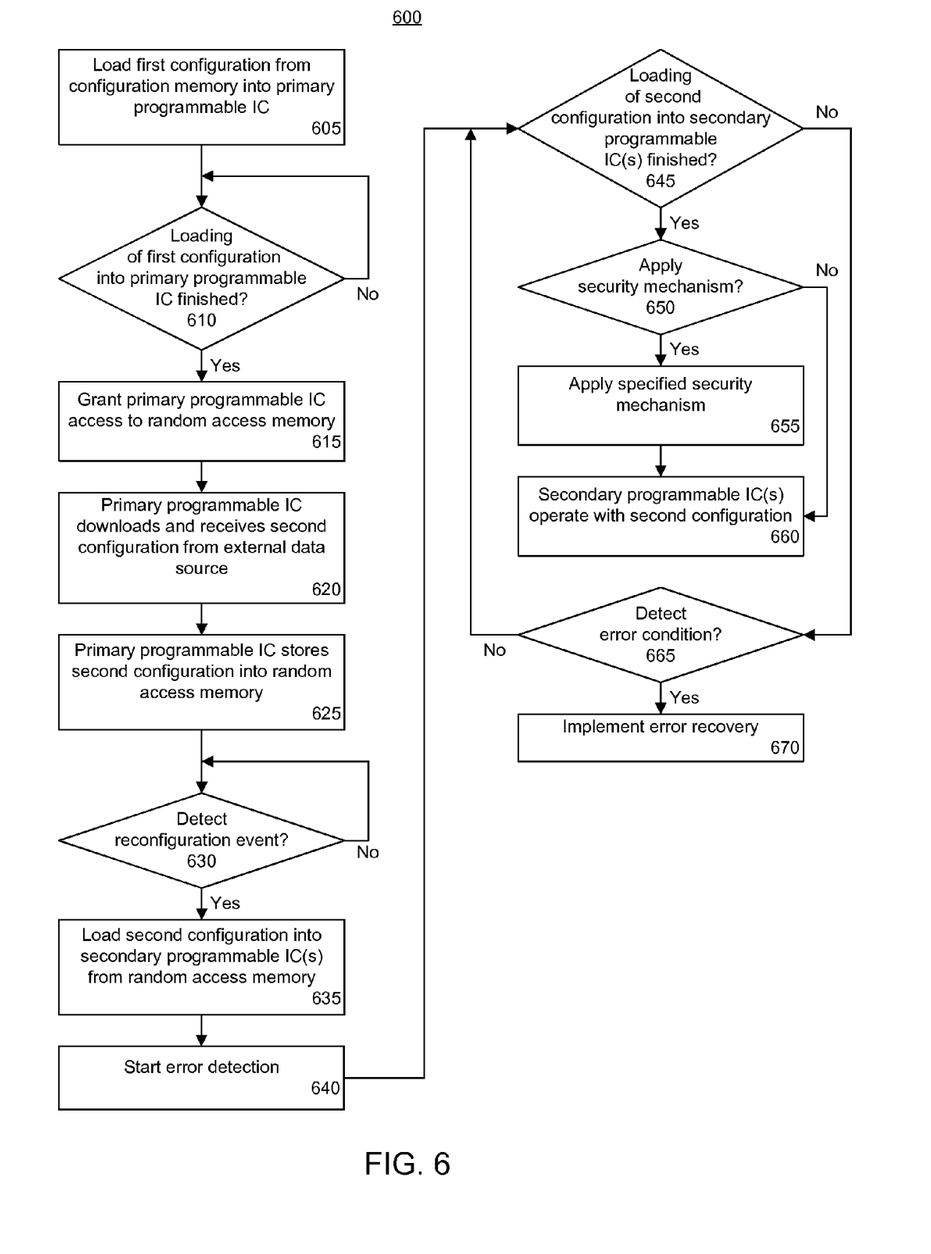
FIG. 6 is a second flow chart illustrating a method of accessing multiple, configuration sources for a programmable IC in accordance with another embodiment of the present invention.

FIG. 6 is a second flow chart illustrating a method 600 of accessing multiple, configuration sources for a programmable IC in accordance with another embodiment of the present invention. Method 600 can be performed using a system comprising a plurality of programmable ICs as described with reference to FIG. 5. Method 600 illustrates a non-limiting embodiment in which the primary programmable IC is loaded with the first configuration and is used to load a second configuration within the secondary programmable IC(s).

Accordingly, method 600 can begin in step 605 where the first configuration can be loaded into the primary programmable IC. In one embodiment, the primary programmable IC can be preloaded with the first configuration as described within this specification. In another embodiment, the primary programmable IC can be loaded with the first configuration immediately at startup of the system within which the primary programmable IC is disposed.

In step 610, the controller can determine whether the loading of the first configuration into the primary programmable IC has finished. If so, method 600 can continue to step 615. If not, method 600 can continue to iterate through step 610. Continuing with step 615, the controller can grant the primary programmable IC access to the RAM. In step 620, the primary programmable IC can download and receive a second configuration from the external data source. In step 625, the primary programmable IC can store the second configuration in RAM.

In step 630, a determination can be made as to whether a reconfiguration event has been detected. The reconfiguration event can be detected by the primary programmable IC or the controller as described. When a reconfiguration event is detected, method 600 can continue to step 635. When a reconfiguration event has not been detected, method 600 can continue to iterate through step 630.

In step 635, the primary programmable IC can load the second configuration from the RAM into the secondary programmable IC(s). The controller, as noted, provides the primary programmable IC with access to the RAM in order to access the second configuration.

In step 640, an error detection process can be implemented. The error detection process can utilize a timer, the counting of data being loaded into the secondary programmable ICs, or a combination of both. The error detection process can be implemented within the controller, the primary programmable IC, or some combination of both.

In step 645, a determination can be made as to whether the process of loading the second configuration into the secondary programmable IC(s) has finished. The determination can be made utilizing the primary programmable IC, the controller, or both. When the process has not yet finished, method 600 can proceed to step 665. When the process has finished, method 600 can proceed to step 650.

Continuing with step 665, when the process of loading the second configuration into the secondary programmable IC(s) has not yet finished, the controller can determine whether an error condition has been detected. When no error condition is detected, method 600 loops back to step 645 to continue the process of loading the second configuration into the secondary programmable IC(s). When an error condition is detected, method 600 continues to step 670, where an error recovery process can be performed. Error recovery can include, for example, erasing the secondary programmable IC(s), loading the first configuration into each of the secondary programmable IC(s), restricting access of any programmable IC to the RAM, or the like.

Referring to step 650, in the case where the process of loading the secondary programmable IC(s) with the second configuration has finished, the controller can determine whether or not a security mechanism is to be applied. When a security mechanism is to be applied as determined in step 650, method 600 can continue to step 655. If not, method 600 can proceed to step 660. In step 655, one or more security mechanisms can be applied as specified in the user-specified security preferences. As noted, the controller can prevent any further loading of a configuration into the primary programmable IC and/or the secondary programmable IC(s) from the RAM. In step 660, the system can enter a state in which the secondary programmable IC(s), being loaded with the second configuration, can operate.

Method 600 describes various features relating to security and detecting error conditions. The various steps described are intended to illustrate aspects of the embodiments of the invention in a non-limiting manner. For example, though not illustrated, the controller or the programmable IC can continually monitor for a reconfiguration event after the loading of the second configuration. Detection of a subsequent reconfiguration event, presuming that a security mechanism has not been implemented, can cause the primary programmable IC to either download a third or different configuration from an external data source or load a different configuration from RAM into the secondary programmable IC(s).

As noted with respect to FIG. 4, more than one configuration can be downloaded and stored in RAM concurrently if so desired. In that case, the RAM can include multiple configurations from which the controller and/or the primary programmable IC can select, or choose, and load into the secondary programmable IC(s) as needed. In one aspect, the particular configuration to be loaded from RAM into the secondary programmable IC(s) can be specified as part of the reconfiguration event that is detected, e.g., specified by a reconfiguration signal. A security override mechanism also can be included that allows the number of configurations N to be overridden in particular circumstances.

The flowcharts in the figures illustrate the architecture, functionality, and operation of possible implementations of systems and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. Within a system comprising a programmable integrated circuit (IC), a method comprising:
  storing a first configuration within the system in a read-only memory that is independent of the programmable IC, wherein the programmable IC, being loaded with the first configuration, comprises a circuit configured to access a data source external to the system over a communication link;
  downloading a second configuration from the data source;
  storing the second configuration within a random access memory disposed within the system that is independent of the programmable IC;
  responsive to a reconfiguration event, loading the second configuration from the random access memory into the programmable IC;
  responsive to the reconfiguration event, determining whether an error condition has occurred from loading the second configuration;
  wherein the second configuration is different from the first configuration; and
  responsive to detecting the error condition, loading the first configuration from the read-only memory into the programmable IC.

2. The method of claim 1, further comprising:
  detecting a predetermined number of successful loads of at least one configuration from the random access memory into the programmable IC; and
  in response to detecting the predetermined number of successful loads, preventing the programmable IC from accessing the random access memory and loading the first configuration from the read-only memory into the programmable IC.

3. The method of claim 1, further comprising:
  detecting a predetermined number of attempted loads of at least one configuration from the random access memory into the programmable IC; and
  in response to detecting the predetermined number of attempted loads, preventing the programmable IC from accessing the random access memory and loading the first configuration from the read-only memory into the programmable IC.

4. The method of claim 1, wherein determining whether an error condition has occurred comprises:
  setting a timer; and
  determining that the timer has expired prior to successfully loading the second configuration from the random access memory into the programmable IC.

5. The method of claim 1, wherein determining whether an error condition has occurred comprises:
  counting an amount of data provided to the programmable IC when loading the second configuration from random access memory into the programmable IC; and
  determining that the amount of data provided exceeds a predetermined amount of data.

6. The method of claim 1, wherein the first configuration instantiates a network interface within the programmable IC for communicating over the communication link, wherein downloading a second configuration comprises the programmable IC, via the network interface, communicating directly with the data source.

7. The method of claim 1, wherein downloading comprises the programmable IC querying a network location corresponding to the data source over a network for the second configuration.

8. A system comprising:
  a random access memory;
  a read-only memory storing a first configuration;
  a programmable integrated circuit (IC), being loaded with the first configuration, comprising a circuit configured to download a second configuration from a data source external to the system over a communication link and store the second configuration within the random access memory; and
  a controller coupled to the programmable IC, the read-only memory, and the random access memory, wherein the controller is configured to selectively grant the programmable IC access to the random access memory and selectively load the first configuration from the read-only memory into the programmable IC,
  wherein responsive to a reconfiguration event, the controller is configured to load the second configuration from the random access memory into the programmable IC,
  wherein the controller is configured to, responsive to the reconfiguration event, determine whether an error condition has occurred from loading the second configuration, and responsive to detecting the error condition, load the first configuration from the read-only memory into the programmable IC, wherein the second configuration is different from the first configuration.

9. The system of claim 8, wherein the controller is configured to detect a predetermined number of loads of at least one configuration from the random access memory into the programmable IC and, in response to detecting the predetermined number of loads, prevent the programmable IC from accessing the random access memory.

10. The system of claim 8, wherein the controller is configured to detect whether an error condition has occurred according to at least one of whether a timer expires or whether an amount of data provided to the programmable IC when loading the second configuration exceeds a predetermined amount of data.

11. The system of claim 8, wherein the programmable IC, when loaded with the first configuration, comprises a network interface for communicating over the communication link, wherein the programmable IC downloads the second configuration from the data source using the network interface.

12. The system of claim 8, wherein responsive to an error condition, the controller is configured to prevent the programmable IC from accessing the random access memory and re-load the first configuration from the read-only memory into the programmable IC.

13. The system of claim 8, wherein the controller is further configured to prevent the programmable IC from storing any additional configuration data within the random access memory.

14. A system comprising:
a random access memory;
a read-only memory storing a first configuration;
a primary programmable integrated circuit (IC), being loaded with the first configuration, comprising a circuit configured to download a second configuration from a data source external to the system over a communication link and store the second configuration within the random access memory; and
at least one secondary programmable IC that is configurable only through the primary programmable IC; and
a controller coupled to the primary programmable IC, the read-only memory, and the random access memory, wherein the controller is configured to selectively grant the primary programmable IC access to the random access memory and to selectively load the first configuration from the read-only memory into at least the primary programmable IC,
wherein responsive to a reconfiguration event, the primary programmable IC, being loaded with the first configuration and having access to the random access memory provided by the controller, is configured to load the second configuration from the random access memory into the at least one secondary programmable IC,
wherein the controller is configured to, responsive to the reconfiguration event, determine whether an error condition has occurred from loading the second configuration, and responsive to detecting the error condition, load the first configuration from the read-only memory into the primary programmable IC, wherein the second configuration is different from the first configuration.

15. The system of claim 14, wherein the controller, responsive to the reconfiguration event, is configured to load the primary programmable IC with the second configuration from the random access memory and the primary programmable IC loads the second configuration into the at least one secondary programmable IC by broadcasting the second configuration received from the random access memory to the at least one secondary programmable IC.

16. The system of claim 14, wherein the controller is configured to detect a predetermined number of loads of at least one configuration from the random access memory into at least one of the primary programmable IC or the at least one secondary programmable IC, and, in response to detecting the predetermined number of loads, prevent the primary programmable IC from accessing the random access memory.

17. The system of claim 14, comprising a server, wherein the at least one secondary programmable IC is disposed within the server and functions as a dynamically reconfigurable processor of the server.

* * * * *